United States Patent
Vardosanidze et al.

(10) Patent No.: US 7,208,021 B1
(45) Date of Patent: *Apr. 24, 2007

(54) FABRICATION OF CLOSE-SPACED MEMS DEVICES BY METHOD OF PRECISE ADHESION REGULATION

(75) Inventors: Lasha Vardosanidze, Tbilisi (GE); Zaza Taliashvili, Tbilisi (GE); Avto Tavkhelidze, Tbilisi (GE); Rodney Thomas Cox, North Plains, OR (US)

(73) Assignee: Borealis Technical Limited, Gibraltar ( * ) Notice: Subject to any disclaimer, the term of this patent is extended or adjusted under 35 U.S.C. 154(b) by 147 days.

This patent is subject to a terminal disclaimer.

(21) Appl. No.: 11/058,308

(22) Filed: Feb. 14, 2005

Related U.S. Application Data

(63) Continuation-in-part of application No. 10/234,498, filed on Sep. 3, 2002, now Pat. No. 7,140,102.

(60) Provisional application No. 60/544,546, filed on Feb. 12, 2004, provisional application No. 60/316,918, filed on Sep. 2, 2001.

(51) Int. Cl.
*H01L 21/00* (2006.01)

(52) U.S. Cl. .................... 29/25.02; 29/831; 29/842; 427/250

(58) Field of Classification Search ........... 29/25.02, 29/831, 842; 427/250
See application file for complete search history.

(56) References Cited

U.S. PATENT DOCUMENTS

| | | | |
|---|---|---|---|
| 3,740,592 A | 6/1973 | Engdahl et al. | |
| 4,011,582 A | 3/1977 | Cline et al. | |
| 4,063,965 A | 12/1977 | Cline et al. | |
| 5,336,547 A | 8/1994 | Kawakita et al. | |
| 5,917,156 A | 6/1999 | Nobori et al. | |
| 6,214,651 B1 | 4/2001 | Cox | |
| 6,225,205 B1 | 5/2001 | Kinoshita | |
| 6,232,847 B1 | 5/2001 | Marcy, 5th et al. | |
| 6,417,060 B2 | 7/2002 | Tavkhelidze et al. | |
| 6,600,252 B2 | 7/2003 | Nguyen | |
| 6,670,864 B2 | 12/2003 | Hyvonen et al. | |
| 7,005,314 B2 * | 2/2006 | Ma et al. ............. | 438/53 |
| 2001/0046749 A1 | 11/2001 | Tavkhelidze et al. | |
| 2003/0006468 A1 * | 1/2003 | Ma et al. ............. | 257/416 |

FOREIGN PATENT DOCUMENTS

WO    WO-99/13562 A1    3/1999

* cited by examiner

*Primary Examiner*—Carl J. Arbes

(57) ABSTRACT

In one aspect, the present invention provides a method for fabricating two layers separated by a gap comprising the steps of: (a) providing a first material; (b) treating the first material to reduce the number of available bonding centers; (c) placing a second material over the first material and allowing bonds to form between the two materials to form a composite; and (d) separating the composite so formed along the boundary of the two materials. In a further aspect, subsequent layers of material may be introduced to the composite by repeating steps (b) and (c) under conditions where adhesion between the subsequent layers is greater, smaller or substantially the same as the adhesion between the first and second material.

13 Claims, 4 Drawing Sheets

FIG. 3
(a)
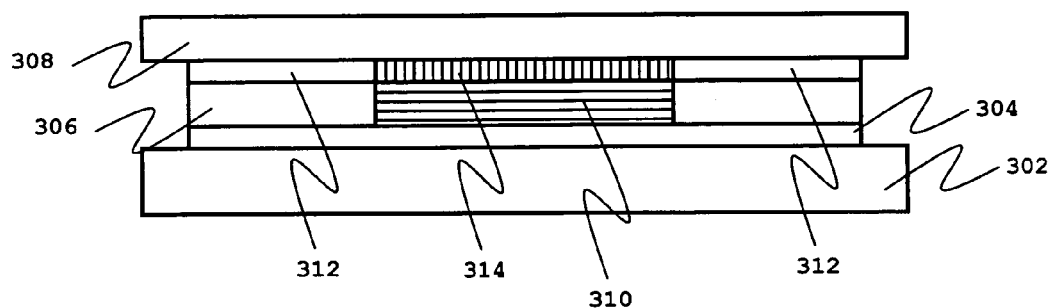
(b)
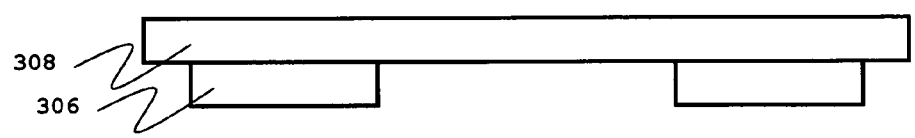
(c)
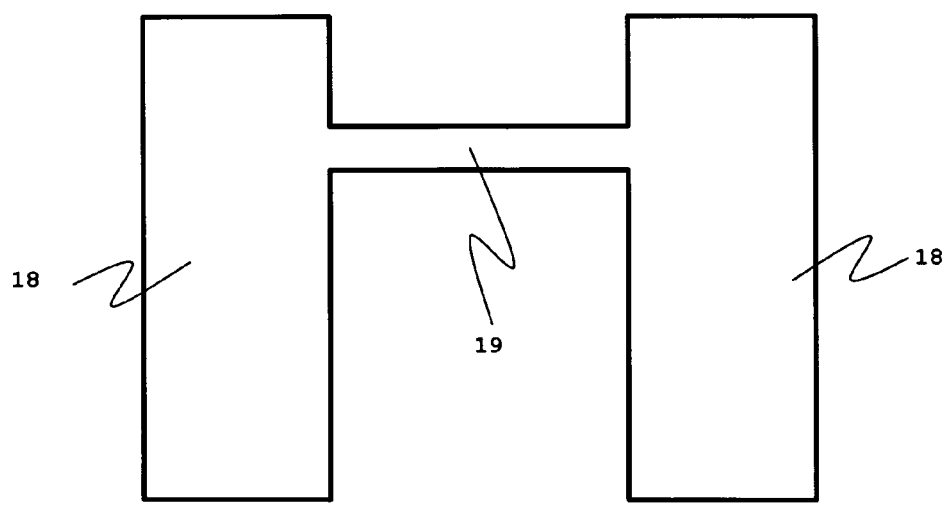

FABRICATION OF CLOSE-SPACED MEMS DEVICES BY METHOD OF PRECISE ADHESION REGULATION

CROSS-REFERENCE TO RELATED APPLICATIONS

This application claims the benefit of U.S. Provisional App. Ser. No. 60/544,546, filed Feb. 12, 2004. This application is also a continuation-in-part of U.S. patent application Ser. No. 10/234,498 filed Sep. 3, 2002, now U.S. Pat. No. 7,140,102, which claims the benefit of U.S. Provisional App. Ser. No. 60/316,918, filed Sep. 2, 2001; the aforementioned are incorporated herein by reference.

BACKGROUND OF THE INVENTION

The present invention relates to adhesion regulation during deposition processes. The present invention also relates to fabrication of MEMS devices. The present invention also relates to increasing the component density in semiconductor devices.

WO99/13562 and U.S. Pat. No. 6,417,060 disclose applications for which it is beneficial to have two separated surfaces which substantially mirror each other, and methods for making pairs of electrodes whose surfaces replicate each other are disclosed therein. The methods involve fabricating a composite by providing a first electrode with a substantially flat surface and placing a sacrificial layer over it. A second material, which will form the second electrode, is placed over the sacrificial layer. The composite is then 'split' into two matching electrodes by removing the sacrificial layer by etching, by cooling the sandwich with liquid nitrogen, or by heating to evaporate the sacrificial layer.

U.S. Pat. No. 6,232,847 discloses a high-Q precision integrated reversibly trimmable single-band oscillator using either a MEMS switching network to selectively interconnect fixed inductors or capacitors or reversibly trimmable MEMS inductors or capacitors to trim the resonant frequency of the local oscillator signal. The MEMS switching network is fabricated using layered deposition regimes involving sacrificial layers.

U.S. patent application Ser. No. 2003/0006468 discloses a method comprising forming a plurality of three dimensional first structures over an area of a substrate. Following the formation of the first structures, the method also includes conformally introducing a sacrificial material over the substrate. A second structural material is then introduced over the sacrificial material followed by the removal of the sacrificial material. The conformal introduction (e.g., deposition) and removal of sacrificial material may be used to form narrow gaps (e.g., on the order of the thickness of the introduced sacrificial material). Accordingly, the method is suitable, in one context, for making microelectromechanical structures (MEMS). Further, the gaps may be formed by deposition and removal of sacrificial material without photolithography steps.

U.S. Pat. No. 6,600,252 discloses several MEMS-based methods and architectures which utilize vibrating micromechanical resonators in circuits to implement filtering, mixing, frequency reference and amplifying functions.

U.S. Pat. No. 6,670,864 discloses a matching circuit for adapting an amplifier to load impedance at various output power levels of the amplifier, and a method for adapting the amplifier to load impedance at various output power levels of the amplifier. The matching circuit comprises an LC circuit, i.e. an electric circuit switching consisting of at least one coil and at least one capacitor for tuning harmonic signals resulting from amplifier non-linearities. At least one capacitor of the LC circuit is an adjustable microelectromechanical (MEMS) capacitor.

These MEMS-based approaches utilize components fabricated using layered deposition regimes involving sacrificial layers. Drawbacks of using sacrificial layers include incomplete removal of the sacrificial layer, and/or damage to one of both of the surfaces by the techniques in contact with the sacrificial layer.

BRIEF SUMMARY OF THE INVENTION

From the foregoing, it may be appreciated that a need has arisen for a method of separating bonded materials to achieve clean separation of the two surfaces, and which does not involve a sacrificial layer.

In general terms the present invention provides a method for regulating the density of bonds between materials, thereby regulating the degree of adhesion between the materials.

In one aspect, the present invention provides a method of fabricating two layers separated by a gap comprising the steps of: (a) providing a first material; (b) treating the first material to reduce the number of available bonding centers; (c) placing a second material over the first material and allowing bonds to form between the two materials to form a composite; and (d) separating the composite so formed along the boundary of the two materials. In a further aspect, subsequent layers of material may be introduced to the composite by repeating steps (b) and (c) under conditions where adhesion between the subsequent layers is greater, smaller or substantially the same as the adhesion between the first and second material.

In a further aspect, the present invention provides a method of fabricating two or more layers separated by a gap comprising the steps of: (a) providing a first material; (b) treating the first material to reduce the number of available bonding centers; (c) placing a second material over the first material and allowing bonds to form between the two materials to form a composite; (d) placing subsequent layers of further materials over the first or second material by repeating steps (b) and (c) under conditions where adhesion between the subsequent layers is greater, smaller or substantially the same as the adhesion between the first and second material; and (e) separating the composite so formed along one or more of the boundaries between materials.

A technical advantage of the present invention is that materials having surfaces that mirror one another may be created without the need for a sacrificial layer. A further technical advantage of the present invention is that the bonded layers may be separated cleanly, with no remnants of one material on the layer opposing.

In accordance with one embodiment of the present invention, the separation step is achieved by applying an electrical current through the materials to separate the surfaces along the boundary of two layers. A technical advantage of this aspect of the present invention is that bonded materials may be easily separated without applying mechanical tension to the materials.

In accordance with a further embodiment of the present invention, the separation step is achieved by cooling or heating the materials, so that the difference in the Thermal Coefficient of Expansion (TCE) between two materials breaks the adhesive bond between the two materials.

In accordance with a further embodiment of the present invention, the separation step is achieved by forcible separation of he two materials to break the adhesion between the two materials. A technical advantage of this aspect of the present invention is that the method may not involve applying or removing heat during the separation process.

In accordance with the present invention, a method of separating materials from one another is provided, comprising the addition or removal of energy, for example by means of an ultrasonic treatment step.

In accordance with a further embodiment of the present invention, the separation step is achieved by combination of two or more of the prior methods.

In a further aspect, the present invention provides matched surfaces that may be positioned in close proximity to each other, with separation distances in the range 0.1 to 100 nm.

In a yet further aspect, the present invention provides a method for fabricating MEMS structures including, but not limited to: adjustable microelectromechanical (MEMS) capacitors; vibrating micromechanical resonators in circuits to implement filtering, mixing, frequency reference and amplifying functions; and MEMS switching networks.

BRIEF DESCRIPTION OF THE SEVERAL VIEWS OF THE DRAWING

Embodiments of the invention will now be described with reference to appropriate figures, which are given by way of example only and are not intended to limit the present invention.

For a more complete explanation of the present invention and the technical advantages thereof, reference is now made to the following description and the accompanying drawings, in which:

FIG. 3 shows in a diagrammatic form a process for making a MEMS device.

DETAILED DESCRIPTION OF THE INVENTION

The embodiments of the present invention and its technical advantages are best understood by referring to FIGS. 1–4. While in this description of the present invention specific methods are disclosed for separating a composite intermediate into two components, these should not be construed as limiting the scope of the invention but as merely providing illustrations of some of the presently preferred embodiments of this invention.

Further, when surface features of two facing surfaces are described as "matching," it means that where one surface has an indentation, the other surface has a protrusion and vice versa. Thus when "matched," the two surfaces are substantially equidistant from each other.

In deposition regime, adhesion between layers strongly depends on the number of atoms on the surface that are looking for additional bonds. Such atoms always exist on the surface because unlike atoms inside the material, which are surrounded by other atoms from all sides, atoms on the surface are able to form bonds only with other adjacent atoms in the bulk material (this effect leads to the well-known phenomenon known as surface tension). Atoms on the surface of a first material that are looking to form additional bonds will immediately link with atoms of a second material as the second material is formed on the surface of the first material. The strength of the adhesion between the two materials will depend on the number of bonds per unit area (density of bonds).

Figure 1:
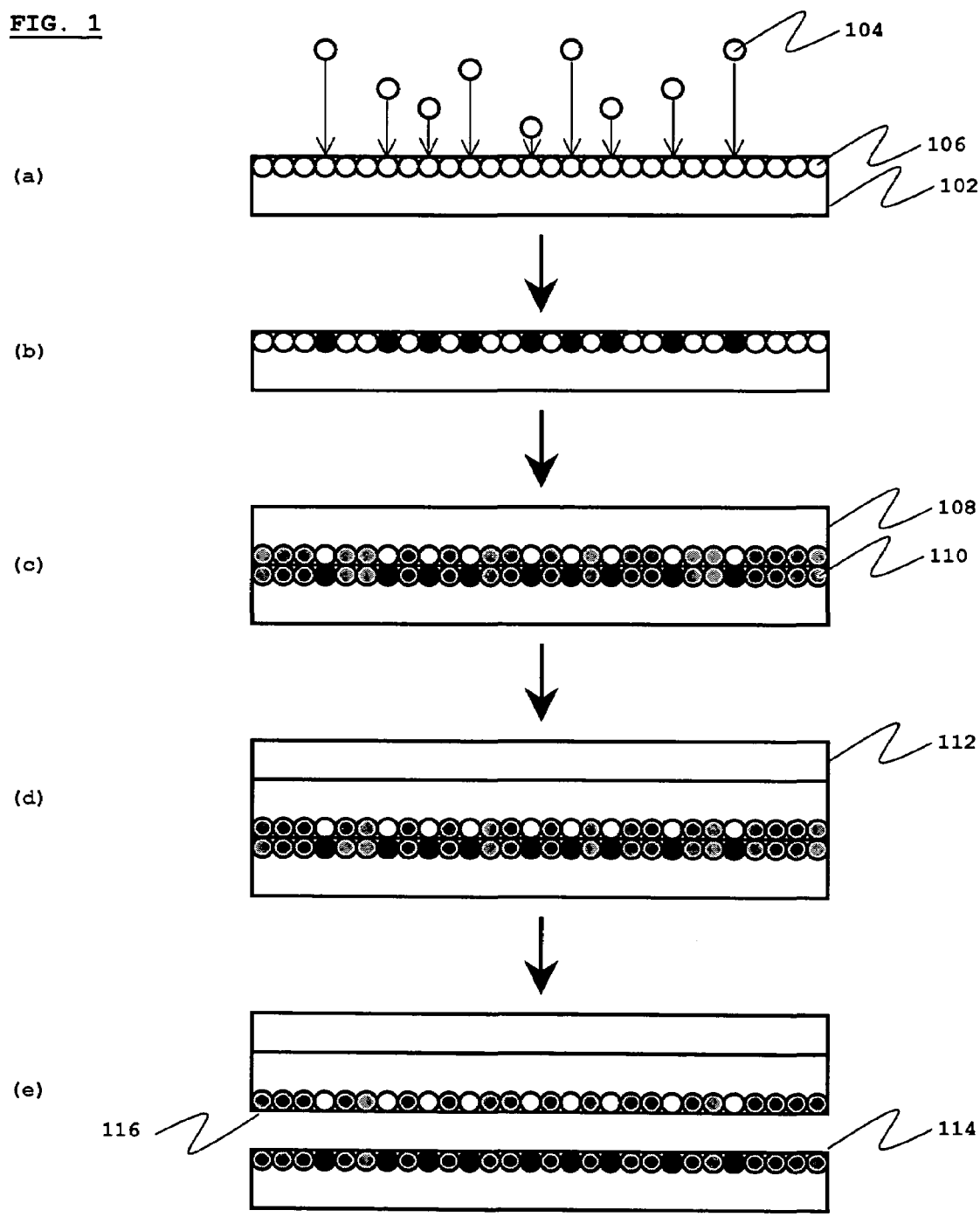
FIG. 1 shows in a diagrammatic form a process for regulating adhesion between layers in MEMS or similar device.

Referring now to FIG. 1, which illustrates the process of adhesion regulation, in a first step (a) a layer 102 is formed under conditions of high vacuum and molecules 104 of residual gas are allowed to react with atoms 106 at the surface of the layer. The residual gas reacts predominantly with atoms on the surface that are looking for additional bonds, effectively passivating them, as indicated diagrammatically in panel (b). The degree of adhesion may be controlled by regulation of the stoichiometry of the reaction, the reaction time and the temperature. Typically the gas is oxygen or water vapor at low partial pressure. In a second step (c), a second layer 108 is formed on the first layer. Atoms not passivated in the previous step react with atoms 110 in the second layer. This yields the composite structure shown in panel (c). One or more further layers 112 are subsequently deposited on one or both of the layers 108 and 102, as shown in step (d). In the embodiment illustrated in FIG. 1, layer 112 is formed under high vacuum in the absence of residual gas, and therefore the adhesion between 112 and 108 is high. The composite structure shown in panel (d) may be separated in the manner shown in step (e) into two parts by the application of current, by cooling or heating, by the application of mechanical force, by a combination of any of the above methods or by any other addition or removal of energy, such as by exposure to an ultrasonic source. Preferably the composite is separated by a change in temperature, so that the difference in the Thermal Coefficient of Expansion (TCE) of 108 and 102 is strong enough to break the reduced adhesion between these layers, but is not strong enough to break the adhesion between 112 and 108.

Although FIG. 1 shows one aspect of the present invention, this should not be construed as limiting the scope of the invention but as merely providing an illustration of a general embodiment of this invention. Thus layer 112 could be treated as shown at step (b) to reduce the adhesion between 112 and 108 to a greater or lesser extent than the adhesion between 108 and 102; this would allow the formation of three separated layers by a repeated application of step (e). Thus step (d) may be repeated to introduce further layers into the composite prior to the application of step (e). Thus step (d) may be repeated to introduce further layers into the composite, and each layer could be treated as shown at step (b) to reduce the adhesion between each layer to a greater or lesser extent than the adhesion between other layers prior to the application of step (e).

Various approaches are known to the art for forming the layers. Preferably layers of material are formed in situ by carefully controlled deposition of component materials in a layer by layer fashion, most preferably by magnetron sputtering or by thermal evaporation. By fabricating these components in situ by carefully controlled deposition of component materials in a layer by layer fashion, and controlling the adhesion between appropriate layers, the precursor component may be split into the active component along the layer which has the lowest adhesion, simply by changing the temperature.

Materials used to form the layers are typically metals, including without limitation tin, silver, nickel, silver and gold.

Figure 2:
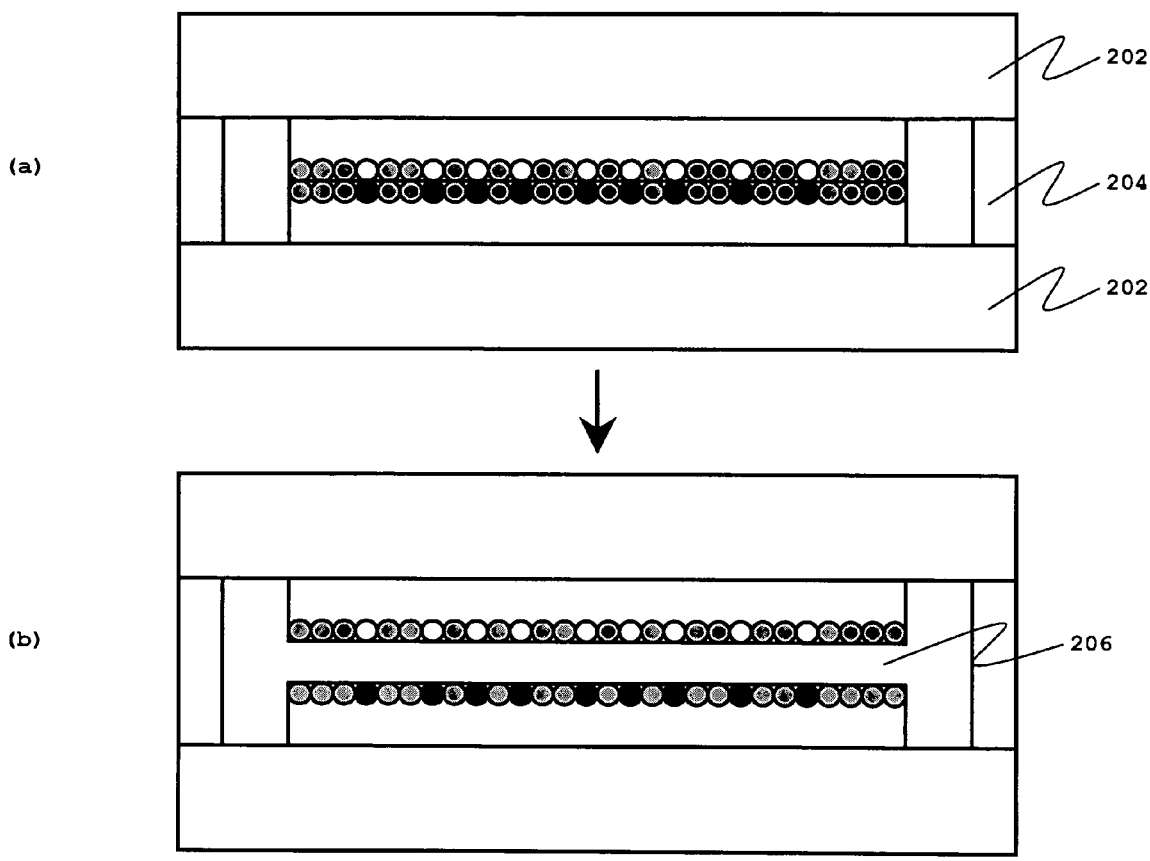
FIG. 2 shows in a diagrammatic form close spaced circuit-bearing substrate elements.
Figure 4:
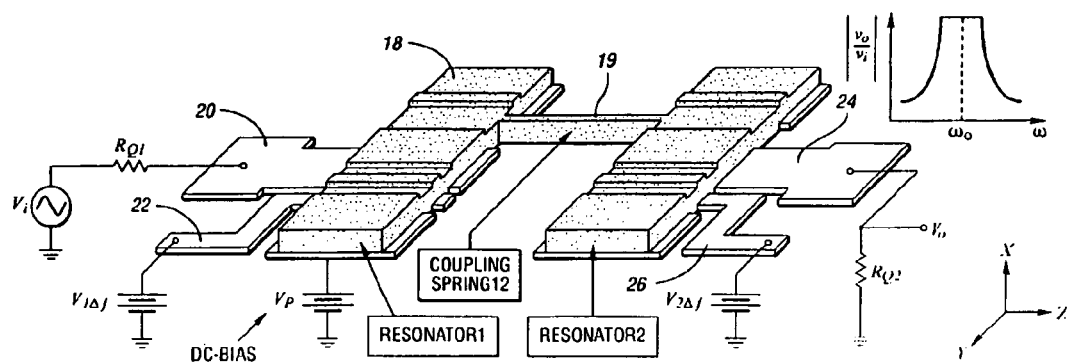
FIG. 4 (prior art) is a perspective schematic view of a symmetrical two-resonator VHF micromechanical filter with typical bias, excitation and signal conditioning electronics.

An important aspect of the present invention is that the two surfaces on either side of the split, 114 and 116, have topological features which match. This means that each part of the split composite may be placed much closer to the other than might otherwise be possible. Thus, in a further embodiment, the present invention may be applied to separating substrate layers in semiconductor device designs. This approach is illustrated in FIG. 2(*b*), which shows a pair of pair of component-bearing substrates 202 separated by a small gap 206 by separation means 204. The separation means may be active devices, such as piezoelectric devices, or passive elements, such as a spacer or a screw-thread. Substrates 202 may be, for example, a semiconductor substrate such as a silicon substrate. It is appreciated that other substrates, such as glass (including silicon on insulator) and ceramic substrates may be suitable. The substrates may have contact points (pads, terminals) disposed on its surface to which device structures (e.g., electrodes, interconnects, etc.) may be formed. Accordingly, substrate 202 may also have conductive traces disposed throughout its body, coupling contact points on the substrate or to another substrate. Substrate 202 may also have one or more device levels, including one or more interconnect levels formed thereon. The structure shown in FIG. 2(*b*) may be fabricated by disposing the composite shown in FIG. 1(*c*) between two substrates 202 prior to causing the composite to split into two halves as shown in FIG. 1(*e*). Substrates 202 may thus be placed in close proximity—sufficiently close that they are closer than the phonon path length, and are thus effectively thermally insulated from each other. This aspect of the invention leads to a greater packing density over current chip designs.

In a further embodiment, the present invention may be applied to the fabrication of MEMS devices, and the number of sacrificial layers reduced or eliminated. In addition, the features and separation distances between component parts of some MEMS devices may be reduced, leading to an increase in packing density. Referring now to FIG. 3, which shows how a MEMS device may be fabricated via a composite structure of the present invention comprising one or more layers, a thin film 304 of material is deposited on substrate 302 under vacuum conditions. Residual gas is allowed to react with the surface of the film as disclosed above, and layer of material 306 is deposited via a mask on layer 304. Material 306 will form part of a MEMS device, such as the micromechanical vibrating device disclosed in U.S. Pat. No. 6,600,252, and shown in FIG. 4. The region between the deposited layer 306 are filled with a removable material 310, and the upper surface of 306 and 304 is planarized as necessary before a 'suspension' layer 312 is deposited through a mask. Again, the non-masked areas are filled with a removable layer 314. The upper surface of 314 and 312 is planarized and substrate 308 deposited. The adhesion between 304 and 306 is sufficiently weak that an alteration in temperature causes the difference in thermal expansion coefficient between the layers to cause a split, and the removable layers 310 and 314 are removed to yield the resonator composite shown in FIG. 3 panels (b) and (c) having two micromechanical clamped-clamped beam resonators with anchors 18 at their opposite ends, coupled mechanically by a soft coupling spring or beam 19, all suspended above a substrate 308. This is shown in perspective view in FIG. 4 (prior art), which is a schematic of a practical two-resonator micromechanical filter capable of operation in the HF to VHF range. As shown, the filter consists of two micromechanical clamped-clamped beam resonators with anchors 18 at their opposite ends, coupled mechanically by a soft coupling spring or beam 19, all suspended above a substrate (not shown). Conductive (polysilicon) strips 20, 22, 24, and 26 underlie each resonator by approximately 100 nm, a center one 20 serving as a capacitive transducer input electrode positioned to induce resonator vibration in a direction perpendicular to the substrate, a center one 24 serving as an output electrode and the flanking ones 22 and 26 serving as tuning or frequency pulling electrodes capable of voltage-controlled tuning of resonator frequencies. The resonator-to-electrode gaps are determined by the thickness of a sacrificial oxide spacer during fabrication and can thus be made quite small (e.g., 100 nm or less) to maximize electromechanical coupling.

Similar approaches may be utilized to fabricate other devices including but not limited to: the switching unit disclosed in U.S. Pat. No. 6,232,847 for a trimmable single-band and tunable multiband integrated oscillator; and the MEMS capacitor disclosed in U.S. Pat. No. 6,670,864, amongst others.

The invention claimed is:

1. A method of fabricating two layers separated by a gap comprising the steps of:
   (a) providing a first material;
   (b) treating the first material to reduce a number of available bonding centers on a surface of said material;
   (c) placing a second material over said surface of the first material and allowing bonds to form between the first and second materials, thereby forming a composite; and
   (d) separating the composite so formed along the boundary of the first and second materials according to a process selected from the group consisting of: applying an electric current between said first material and said second material, applying a mechanical force between said first material and said second material, applying energy to the composite, removing energy from the composite, exposing the composite to an ultrasonic energy source, heating the composite, and cooling the composite.

2. The method of claim 1 wherein said step of treating the first material to reduce a number of available bonding centers comprises exposing said first material to a gas able to react with said bonding centers.

3. The method of claim 2 wherein said gas is oxygen at low partial pressure.

4. The method of claim 2 wherein said gas is water vapor at low partial pressure.

5. The method of claim 2 wherein said step of exposing said first material to a gas comprises exposing said first material to a gas for a predetermined time and a predetermined temperature, thereby reducing a number a number of available bonding centers by a predetermined amount.

6. The method of claim 1 wherein said step of placing a second material comprises a process selected from the group consisting of: magnetron sputtering and thermal evaporation.

7. A process for fabricating MEMS devices comprising the method of claim 1.

8. A method of fabricating two layers separated by a gap comprising the steps of:
   (a) providing a first material;
   (b) treating the first material to reduce a number of available bonding centers on a surface of said material;

(c) placing a second material over said surface of the first material and allowing bonds to form between the first and second materials, thereby forming a composite;
(d) separating the composite so formed along the boundary of the first and second materials; and
(e) repeating step (c) a number of times.

9. The method of claim 8 additionally comprising repeating step (b) a number of times, and separating said composite into three or more components along boundaries between materials.

10. A process for fabricating MEMS devices comprising the method of claim 8.

11. A method of fabricating two layers separated by a gap comprising the steps of:
(a) placing a first material on a first substrate;
(b) treating the first material to reduce a number of available bonding centers on a surface of said material;
(c) placing a second material over said surface of the first material and allowing bonds to form between the first and second materials, thereby forming a composite; and
(d) attaching said second material of said composite to a second substrate prior to said step of:
(e) separating said composite so formed along the boundary of the first and second materials.

12. The method of claim 11 wherein one or both of said first and second substrate has disposed thereupon circuit elements, and wherein following said step of separating the composite, positioning and maintaining said first and second substrates at a distance less than a phonon path length.

13. A process for fabricating MEMS devices comprising the method of claim 11.

* * * * *